United States Patent
Nguyen et al.

(10) Patent No.: US 8,987,133 B2
(45) Date of Patent: Mar. 24, 2015

(54) TITANIUM OXYNITRIDE HARD MASK FOR LITHOGRAPHIC PATTERNING

(71) Applicant: International Business Machines Corporation, Armonk, NY (US)

(72) Inventors: Son V. Nguyen, Schenectady, NY (US); Tuan A. Vo, Albany, NY (US); Christopher J. Waskiewicz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 243 days.

(21) Appl. No.: 13/741,638

(22) Filed: Jan. 15, 2013

(65) Prior Publication Data

US 2014/0199832 A1 Jul. 17, 2014

(51) Int. Cl.
*H01L 21/768* (2006.01)
*H01L 21/48* (2006.01)

(52) U.S. Cl.
CPC .................................... *H01L 21/486* (2013.01)
USPC ............ 438/637; 438/641; 438/700; 438/687

(58) Field of Classification Search
USPC .................. 438/618–688, 700–703, 706, 745
See application file for complete search history.

(56) References Cited

U.S. PATENT DOCUMENTS

| | | | |
|---|---|---|---|
| 5,122,225 A | 6/1992 | Douglas | |
| 6,399,446 B1 | 6/2002 | Rangarajan et al. | |
| 6,531,404 B1 | 3/2003 | Nallan et al. | |
| 6,534,809 B2 | 3/2003 | Moise et al. | |
| 6,809,033 B1 | 10/2004 | Hui et al. | |
| 6,828,161 B2 | 12/2004 | Summerfelt et al. | |
| 7,045,070 B1 | 5/2006 | Weinrich et al. | |
| 7,922,824 B2 * | 4/2011 | Minsek et al. | 134/1.3 |
| 7,981,777 B1 | 7/2011 | Subramonium et al. | |
| 8,409,914 B2 * | 4/2013 | Sung | 438/104 |
| 2007/0037385 A1 * | 2/2007 | Huebinger et al. | 438/638 |
| 2009/0215658 A1 * | 8/2009 | Minsek et al. | 510/175 |
| 2010/0006425 A1 * | 1/2010 | Fu et al. | 204/192.25 |
| 2010/0025797 A1 * | 2/2010 | Rothenbury et al. | 257/436 |
| 2011/0101507 A1 * | 5/2011 | Akinmade Yusuff et al. | 257/632 |
| 2011/0186086 A1 * | 8/2011 | Minsek et al. | 134/26 |
| 2012/0256269 A1 * | 10/2012 | Goswami | 257/369 |
| 2013/0296214 A1 * | 11/2013 | Barnes et al. | 510/176 |

OTHER PUBLICATIONS

Tang, T.E. et al., "Titanium Nitride Local Interconnect Technology for VLSI" IEEE Transactions on Electron Devices (Mar. 1987) pp. 682-688, vol. ED-34, No. 3.

* cited by examiner

*Primary Examiner* — Savitr Mulpuri
(74) *Attorney, Agent, or Firm* — Scully, Scott, Murphy & Presser, P.C.; Catherine Ivers

(57) ABSTRACT

A vertical stack including a dielectric hard mask layer and a titanium nitride layer is formed over an interconnect-level dielectric material layer such as an organosilicate glass layer. The titanium nitride layer may be partially or fully converted into a titanium oxynitride layer, which is subsequently patterned with a first pattern. Alternately, the titanium nitride layer, with or without a titanium oxynitride layer thereupon, may be patterned with a line pattern, and physically exposed surface portions of the titanium nitride layer may be converted into titanium oxynitride. Titanium oxynitride provides etch resistance during transfer of a combined first and second pattern, but can be readily removed by a wet etch without causing surface damages to copper surfaces. A chamfer may be formed in the interconnect-level dielectric material layer by an anisotropic etch that employs any remnant portion of titanium nitride as an etch mask.

9 Claims, 12 Drawing Sheets

TITANIUM OXYNITRIDE HARD MASK FOR LITHOGRAPHIC PATTERNING

BACKGROUND

The present disclosure relates to semiconductor processing methods, and particularly to methods for patterning a dielectric material layer employing a titanium oxynitride hard mask and structures for effecting the same.

In semiconductor manufacturing, patterning of a dielectric material layer to form via trenches and line trenches is necessary to form metal interconnect structures. Titanium nitride (TiN) hard mask layer consisting of titanium and nitrogen is frequently employed as a hard mask layer during the patterning process.

Unfortunately, removal of a TiN hard mask layer cannot be easily performed without causing collateral damages. Removal of the TiN hard mask layer by a reactive ion etch after formation of a dual damascene cavity causes damages to physically exposed copper surfaces of underlying interconnect structures. Removal of the TiN hard mask layer by a wet etch can also attack the physically exposed copper surfaces of an underlying interconnect structures. Removal of the TiN hard mask layer by a wet etch prior to physically exposing copper surfaces of underlying interconnect structures results in widening of lateral dimensions of via cavities and an increase in the probability of forming physically shorted via structures.

BRIEF SUMMARY

Integration schemes that employ a titanium oxynitride hard mask layer are disclosed. A vertical stack including a dielectric hard mask layer and a titanium nitride layer is formed over an interconnect-level dielectric material layer such as an organosilicate glass layer. The titanium nitride layer may be partially or fully converted into a titanium oxynitride layer, which is subsequently patterned with a line pattern. Alternately, the titanium nitride layer, with or without a titanium oxynitride layer thereupon, may be patterned with a first pattern, and physically exposed surface portions of the titanium nitride layer may be converted into titanium oxynitride. Titanium oxynitride provides etch resistance during transfer of a combined first and second pattern, but can be readily removed by a wet etch without causing surface damages to copper surfaces. A chamfer may be formed in the interconnect-level dielectric material layer by an anisotropic etch that employs any remnant portion of titanium nitride as an etch mask.

According to an aspect of the present disclosure, a method of forming a patterned structure is provided. A vertical stack including an interconnect-level dielectric material layer, a dielectric hard mask layer, and a patterned titanium oxynitride layer defining a first pattern is formed over a substrate. A patterned lithographic material stack including at least a patterned photoresist layer over the titanium oxynitride layer is formed. The patterned photoresist layer includes a second pattern. The interconnect-level dielectric material layer is etched employing a combination of the patterned lithographic material stack and the patterned titanium oxynitride layer to form a cavity embedded within the interconnect-level dielectric material layer.

DETAILED DESCRIPTION

Figure 1:
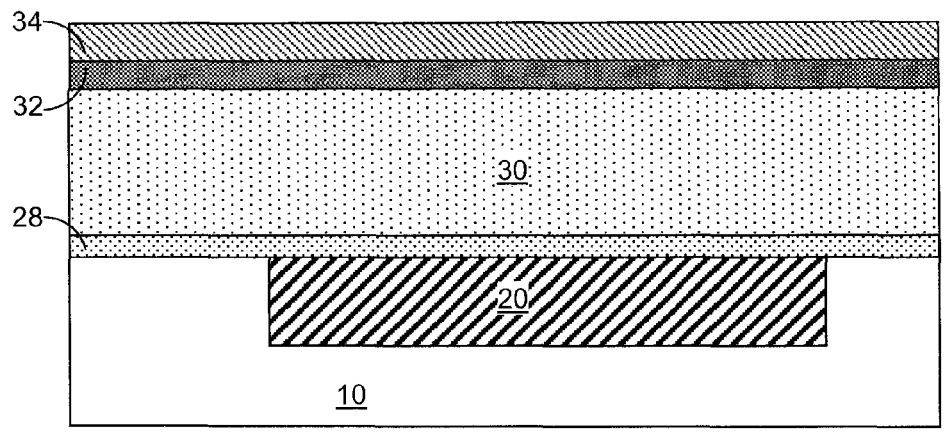
FIG. 1 is a vertical cross-sectional view of a first exemplary structure after formation of an interconnect-level dielectric material layer, a dielectric hard mask layer, and a titanium nitride layer according to a first embodiment of the present disclosure.

As stated above, the present disclosure relates to methods for patterning a dielectric material layer employing a titanium oxynitride hard mask and structures for effecting the same, which are now described in detail with accompanying figures. Throughout the drawings, the same reference numerals or letters are used to designate like or equivalent elements. The drawings are not necessarily drawn to scale.

Referring to FIG. 1, a first exemplary structure according to a first embodiment of the present disclosure includes a substrate 10, an underlying metal interconnect structure 20 embedded within the substrate 10, an etch stop dielectric layer 28, an interconnect-level dielectric layer 30, a dielectric hard mask layer 32, and a titanium nitride (TiN) layer 34. The substrate 10 can include a stack of a semiconductor substrate (not separately shown) including at least one semiconductor device therein and at least one underlying interconnect-level dielectric layer (not separately shown) that embeds the underlying metal interconnect structure 20. The underlying metal interconnect structure 20 can be a metal line that provides a lateral electrical connection, a metal via structure that provides a vertical electrical connection, or a combination of at least one metal line and at least one metal via structure. The at least one underlying interconnect-level dielectric layer can be a single interconnect-level dielectric layer or a plurality of interconnect-level dielectric layers. The underlying metal interconnect structure 20 can be conductively connected to one or more semiconductor devices on the semiconductor substrate. In some embodiment, the underlying metal interconnect structure 20 and/or the etch stop dielectric layer 28 may be absent, and the interconnect-level dielectric layer 30 or the etch stop dielectric layer 28 may be formed directly on at least one semiconductor device such as a field effect transistor, a bipolar transistor, a capacitor, an inductor, a diode, etc.

The etch stop dielectric layer 28 includes a dielectric material that can function as an etch stop material for an etch process to be subsequently employed to etch the interconnect-level dielectric layer 30. The etch stop dielectric layer 28 can include, for example, nitrogen-doped organosilicate glass, silicon oxide, silicon nitride, or a combination thereof. The etch stop dielectric layer 28 can be formed, for example, by chemical vapor deposition (CVD). The thickness of the etch stop dielectric layer 28 can be from 5 nm to 20 nm, although lesser and greater thicknesses can also be employed.

The interconnect-level dielectric layer 30 includes a dielectric material such as porous or non-porous organosilicate glass, undoped silicate glass (USG), or a doped silicate glass such as fluorosilicate glass (FSG). The interconnect-level dielectric layer 30 can be formed, for example, by chemical vapor deposition. The thickness of the interconnect level dielectric layer 30 can be from 30 nm to 1,000 nm, although lesser and greater thicknesses can also be employed.

The dielectric hard mask layer 32 includes a dielectric material that can be employed as a stopping layer for a planarization process and for reducing corner erosion by reaction ion processing or litho rework purpose to be subsequently employed to remove a metallic material from above the dielectric hard mask layer 32. The dielectric hard mask layer 32 includes a dielectric material such as silicon oxide, silicon oxynitride, silicon nitride, and nitrogen-doped organosilicate glass, or a combination thereof. In one embodiment, the dielectric hard mask layer 32 can include silicon oxide deposited by chemical vapor deposition or plasma chemical vapor deposition process that employs tetraethylorthosilicate (TEOS) and oxygen as precursors. The thickness of the dielectric hard mask layer 32 can be from 5 nm to 20 nm, although lesser and greater thicknesses can also be employed.

The TiN layer 34 can be formed as a blanket TiN layer, i.e., a TiN layer without any pattern therein and having a uniform thickness throughout the entirety thereof. The TiN layer 34 consists essentially of titanium nitride. The TiN layer can be deposited, for example, by physical vapor deposition (PVD), i.e., by sputtering. The ratio of titanium atoms to nitrogen atoms in the TiN layer can be substantially equal to 1.0. The thickness of the TiN layer 34 can be from 10 nm to 50 nm, although lesser and greater thicknesses can also be employed.

Figure 2:
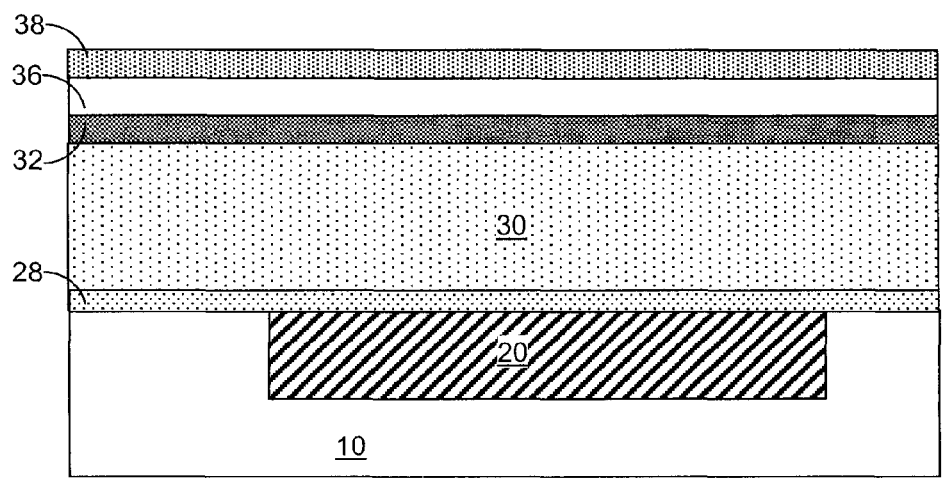
FIG. 2 is a vertical cross-sectional view of the first exemplary structure after conversion of the titanium nitride layer into a titanium oxynitride layer and formation of a dielectric oxide layer according to the first embodiment of the present disclosure.

Referring to FIG. 2, the TiN layer 34 is converted into a titanium oxynitride layer 36 through a plasma treatment or electrochemical oxidation. The entirety of the TiN layer 34 can be converted into the titanium oxynitride layer 36. In one embodiment, the plasma treatment causes plasma oxidation of the titanium nitride material in the TiN layer 34. The plasma treatment can employ a plasma of an oxygen-containing gas. As used herein, an "oxygen-containing gas" refers to a gas including at least one oxygen atom. Non-limiting examples of oxygen-containing gases include $O_2$, $N_2O$, $H_2O$ and $CO_2$. Alternately, electrochemical oxidation of titanium nitride may be employed to form the titanium oxynitride layer 36. The titanium oxynitride layer 36 does not include any pattern and has a uniform thickness throughout, i.e., is a blanket titanium oxynitride layer. The resulting titanium oxynitride material is more easily removed compared to titanium nitride material by various wet etch chemistries. For example, a wet etch chemistry employing dilute hydrofluoric acid or a combination of hydrogen peroxide and trans-1,2-cyclohexanediaminetetraacetic acid (CDTA) can remove titanium oxynitride at an etch rate that is at least an order of magnitude greater than the etch rate of titanium nitride by the same wet etch chemistry.

In one embodiment, plasma oxidation of titanium nitride can be performed employing an oxygen plasma to convert the titanium nitride material of the TiN layer 34 into a titanium oxynitride material. A complete oxidation of titanium nitride has the reaction formula of:

$$TiN+O_2 \rightarrow TiO_2+\frac{1}{2}N_2(\Delta G=-611.8 \text{ kJ/mol at 298 K}).$$

In the case of partial oxidation, the reaction formula is:

$$TiN+x/2O_2 \rightarrow TiO_xN_y+(1-y)/2N_2.$$

The titanium oxynitride material in the titanium oxynitride layer 36 has a composition of $TiO_xN_y$, in which x can be in a range from 0.1 to 1.9, and y can be in a range from 0.05 to 0.95, and (1−x)+2y can be in a range from 0.9 to 2.4. Small deviation from the formula can also acceptable since slight Ti-rich $TiO_xN_y$ will also work effectively for this application. Exemplary process parameters that can be employed to generate the oxygen plasma in a process chamber configured to process a 300 mm semiconductor substrate include a typical pressure in a range from 5 mTorr to 2000 mTorr, radiofrequency (13.56 MHz RF) power level in a range from 200 W to 1 kW at a frequency from 1 MHz to 100 MHz, $O_2$ gas flow in a range from 50 sccm to 2 slm, and a processing temperature in a range from 20 degree Celsius to 300 degree Celsius.

In another embodiment, plasma oxidation of titanium nitride can be performed employing a carbon dioxide plasma to convert the titanium nitride material of the TiN layer 34 into a titanium oxynitride material. The titanium oxynitride material in the titanium oxynitride layer 36 has a composition of $TiO_xN_y$, in which x can be in a range from 0.1 to 1.9, and y can be in a range from 0.05 to 0.95, and (1−x)+2y can be in a range from 0.9 to 2.4. Small deviation from the formula can also acceptable since slight Ti-rich $TiO_xN_y$ will also work effectively for this application. Exemplary process parameters that can be employed to generate the oxygen plasma in a process chamber configured to process a 300 mm semiconductor substrate include a pressure in a range from 5 mTorr to 200 mTorr, radiofrequency (RF) power level in a range from 200 W to 1 kW at a frequency from 1 MHz to 100 MHz, $CO_2$ gas flow in a range from 50 sccm to 2 slm, and a processing temperature in a range from 20 degree Celsius to 300 degree Celsius.

In yet another embodiment, electrochemical oxidation of titanium nitride can be employed to convert the titanium nitride material into a titanium oxynitride material. Titanium nitride can be converted into various materials by electrochemical oxidation. The various processes that can occur during electrochemical oxidation of titanium nitride include:

$$TiN+2H_2O \rightarrow TiO_2+\frac{1}{2}N_2+4H^++4e^- \quad \text{(Reaction 1);}$$

$$TiN \rightarrow Ti^{3+}+\frac{1}{2}N_2+3e^- \quad \text{(Reaction 2);}$$

$$TiN+3H_2O \rightarrow Ti(OH)_3+\frac{1}{2}N_2+3H^++3e^- \quad \text{(Reaction 3); and}$$

$$TiN+3H_2O \rightarrow TiO_2.H_2O+\frac{1}{2}N_2+4H^++4e^- \quad \text{(Reaction 4).}$$

Partial oxidation of the titanium nitride material through electrochemical oxidation in combination with dehydration can be employed to provide the titanium oxynitride material of the titanium oxynitride layer 36. The titanium oxynitride material in the titanium oxynitride layer 36 has a composition of $TiO_xN_y$, in which x can be in a range from 0.1 to 1.9, and y can be in a range from 0.05 to 0.95, and (1−x)+2y can be in a range from 0.9 to 2.4. Small deviation from the formula can also acceptable since slight Ti-rich $TiO_xN_y$ will also work effectively for this application. The amount of TiN HM to be removed will depend on the plasma treatment.

The dielectric hard mask layer 32 protects the dielectric material of the interconnect-level dielectric layer 30 during the partial oxidation of the TiN layer 34. The titanium oxynitride material in the titanium oxynitride layer 36 is resistant to the etch chemistry to be subsequently employed to etch the dielectric material of the interconnect-level dielectric layer 30.

A dielectric oxide layer 38 can be subsequently formed over the TiN layer 34, for example, by chemical vapor deposition (CVD) or atomic layer deposition (ALD). The dielectric oxide layer 38 includes a dielectric oxide material such as silicon oxide or a dielectric metal oxide such as $Al_2O_3$, $HfO_2$, $ZrO_2$, or other materials commonly known as high-k gate dielectric materials and having a dielectric constant greater than 8.0. The thickness of the dielectric oxide layer 38 can be from 5 nm to 50 nm, although lesser and greater thicknesses can also be employed. The dielectric oxide layer 38 is optional. Embodiments in which a dielectric oxide layer 38 is not employed are expressly contemplated herein. If the dielectric oxide layer 38 is present, the dielectric oxide layer 38 may be used as a protection layer during lithographic rework. In a lithographic rework process, a photoresist material with a misaligned pattern can be removed and replaced with an unpatterned photoresist material for another attempt for lithographic patterning.

Figure 3:
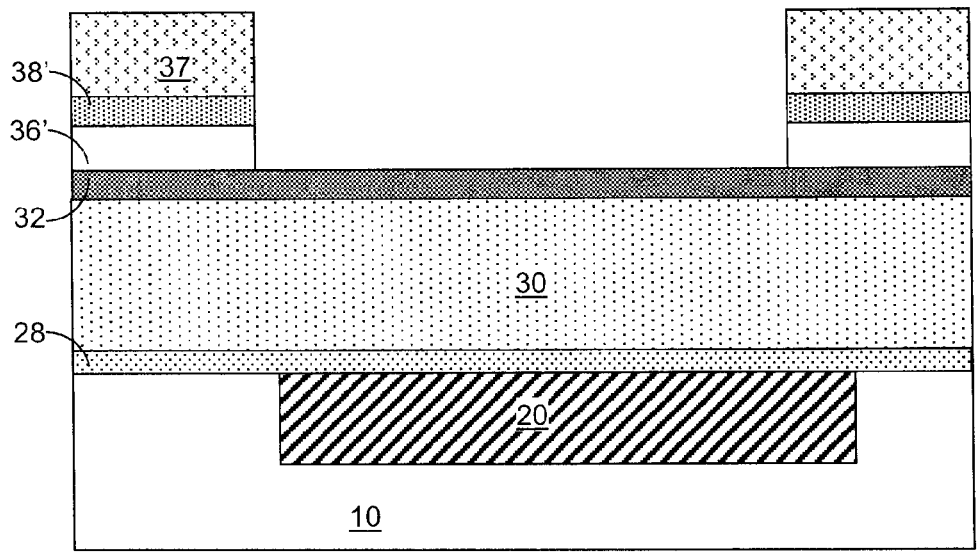
FIG. 3 is a vertical cross-sectional view of the first exemplary structure after patterning of the titanium oxynitride layer with a first pattern according to the first embodiment of the present disclosure.

Referring to FIG. 3, a first photoresist layer 37 is applied over the dielectric oxide layer 38, and is lithographically patterned to form a first pattern including at least one first opening therein. The first pattern can be a pattern for metal lines to be subsequently formed within the interconnect-level dielectric layer 30. The first pattern is transferred into the stack of the dielectric oxide layer 38 and the titanium oxynitride layer 36 by at least one anisotropic etch. The remaining portion of the dielectric oxide layer 38 constitutes a patterned dielectric oxide layer 38' including the first pattern. The remaining portion of the titanium oxynitride layer 36 constitutes a patterned titanium oxynitride layer 36' including the first pattern. The pattern transfer can be effected, for example, by a dry etch such as an anisotropic reactive ion etch or by a wet etch employing dilute hydrofluoric acid. The first photoresist layer 37 can be subsequently removed, for example, by ashing.

Figure 4:
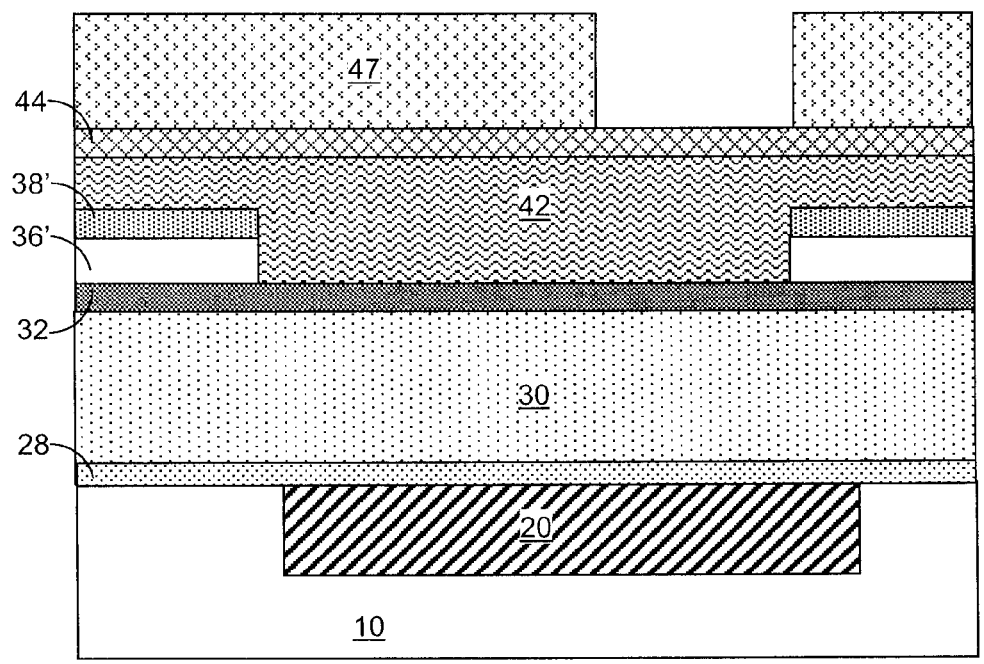
FIG. 4 is a vertical cross-sectional view of the first exemplary structure after formation of a lithographic stack including a photoresist layer and patterning of the photoresist layer with a second pattern according to the first embodiment of the present disclosure.

Referring to FIG. 4, a lithographic stack including an organic planarization layer (OPL) 42, an optional antireflective coating (ARC) layer 44, and a second photoresist layer 47 is formed over the stack of the patterned dielectric oxide layer 38' and the patterned titanium oxynitride layer 36'. The OPL 42 includes an organic self-planarizing material, and may optionally include silicon or fluorine. The thickness of the OPL 42, as measured from above the top surface of the patterned dielectric oxide layer 38', can be from 30 nm to 300 nm, although lesser and greater thicknesses can also be employed. The optional ARC layer 44 can include any antireflective coating material known in the art, and can have a thickness from 10 nm to 200 nm, although lesser and greater thicknesses can also be employed.

The second photoresist layer 47 is lithographically patterned to form a second pattern including at least one second opening therein. The second pattern can be a pattern for metal via structures to be subsequently formed within the interconnect-level dielectric layer 30. In one embodiment, the area of the first opening and the area of the second opening can overlap with each other. A patterned lithographic material stack (42, 44, 47) including a patterned second photoresist layer 47, the optional ARC layer 44, and the OPL 42 is formed over the titanium oxynitride layer 36' at this step.

Figure 5:
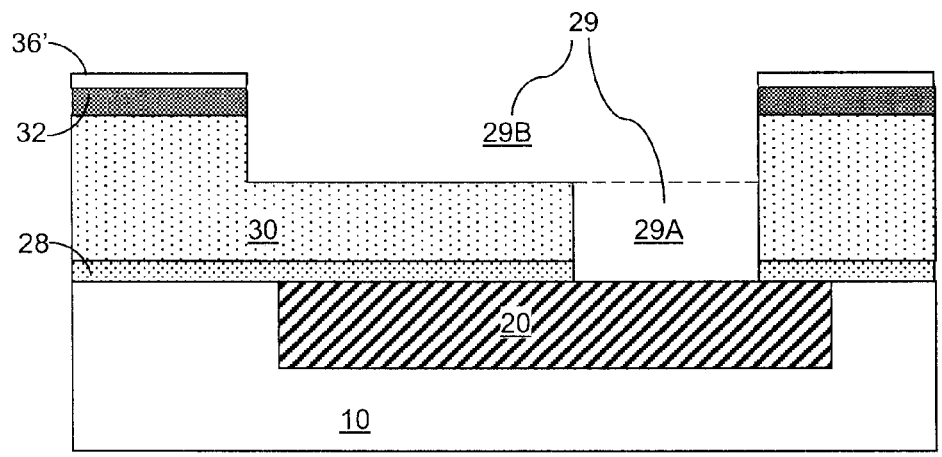
FIG. 5 is a vertical cross-sectional view of the first exemplary structure after transfer of a composite pattern of the first and second patterns into the interconnect-level dielectric material layer according to the first embodiment of the present disclosure.

Referring to FIG. 5, the interconnect-level dielectric material layer 30 can be etched employing a combination of the patterned lithographic material stack (42, 44, 47) and the stack of the patterned dielectric oxide layer 38' and the patterned titanium oxynitride layer 36' to form a dual damascene cavity 29 embedded within the interconnect-level dielectric material layer 30. Specifically, the second pattern in the second photoresist layer 47 is transferred through the optional ARC layer 44, the OPL 42, the dielectric hard mask layer 32, and the interconnect-level dielectric layer 30 by at least one anisotropic etch. If the area of the second opening overlies a portion of the stack of the patterned dielectric oxide layer 38' and the patterned titanium oxynitride layer 36', the area of the pattern transferred through the dielectric hard mask layer 32 and the interconnect-level dielectric layer 30 can be the intersection of the first pattern and the second pattern, i.e., the common area between the first opening and the second opening. In this case, the stack of the patterned dielectric oxide layer 38' and the patterned titanium oxynitride layer 36' restricts the transfer of the first pattern through the dielectric hard mask layer 32 and the interconnect-level dielectric layer 30. The portion of the interconnect-level dielectric layer 30 within the common area between the first opening and the second opening is completely removed down to the etch stop dielectric layer 28 to form a via cavity 29A.

The second photoresist layer 47 and the optional ARC layer 44 may be partially or completely removed during the at least one anisotropic etch. Further, the OPL 42 may be partially or completely removed during the at least one anisotropic etch. After the pattern of the intersection of the first pattern and the second pattern is transferred at least through the dielectric hard mask layer 32, the OPL 42 may be removed so that the second pattern in the patterned titanium oxynitride layer 36 is physically exposed. In one embodiment, the pattern of the intersection of the first pattern and the second pattern may be transferred to a depth between the top surface of the interconnect-level dielectric material layer 30 and the bottom surface of the interconnect-level dielectric material layer 30 when the OPL is completely removed by the at least one anisotropic etch, or by ashing.

Subsequently, the first pattern in the patterned titanium oxynitride layer 36' is transferred through the dielectric hard mask layer 32 and an upper portion of the interconnect-level dielectric layer 30 by another anisotropic etch that employs the patterned titanium oxynitride layer 36' as an etch mask. During this anisotropic etch, the via cavity 29A can be extended downward through the etch stop dielectric layer 28 so that a top surface of the underlying metal interconnect structure 20 is physically exposed. Further, a line cavity 29B having the same horizontal cross-sectional area as the area of the first pattern is formed in the upper portion of the interconnect-level dielectric layer 30. The line cavity 29B vertically extends from a horizontal plane between the topmost surface and the bottommost surface of the interconnect-level dielectric layer 30 and the top surface of the patterned titanium oxynitride layer 36'. The via cavity 29A and the line cavity 29B are connected to each other, and collectively form a dual damascene cavity 29. The patterned lithographic material stack (42, 44, 47) and the patterned dielectric oxide layer 38' can be consumed during the anisotropic etches that transfer the combined pattern into the interconnect-level dielectric layer 30. The patterned titanium oxynitride layer 36' may be thinned during the pattern transfer.

Figure 6:
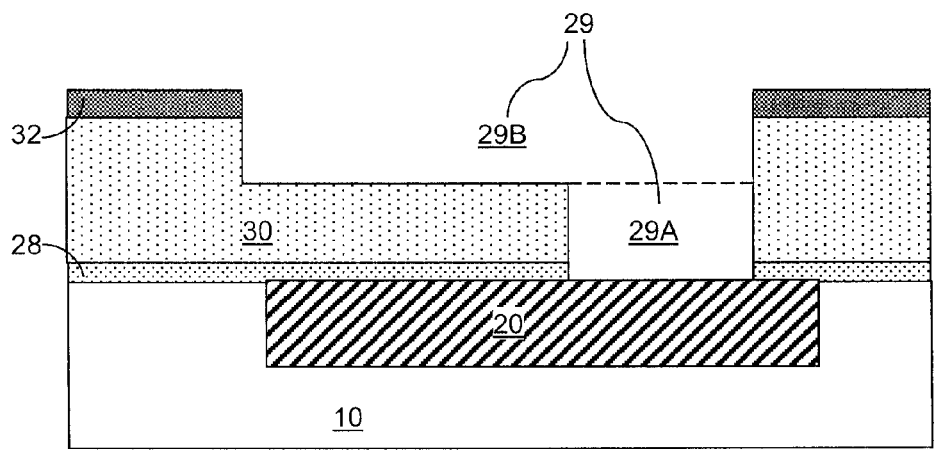
FIG. 6 is a vertical cross-sectional view of the first exemplary structure after removal of the patterned titanium oxynitride layer according to the first embodiment of the present disclosure.

Referring to FIG. 6, the patterned titanium oxynitride layer 36' can be removed selective to the dielectric hard mask layer 32, i.e., without etching any substantial amount of the dielectric hard mask layer 32. The removal of the patterned titanium oxynitride layer 36' can be selective to the dielectric materials of the interconnect-level dielectric layer 30 and the etch stop dielectric layer 28. The selective removal of the patterned titanium oxynitride layer 36' can be effected, for example, employing a wet etch, which can employ, for example, dilute hydrofluoric acid or a combination of hydrogen peroxide and trans-1,2-cyclohexanediaminetetraacetic acid (CDTA).

Figure 7:
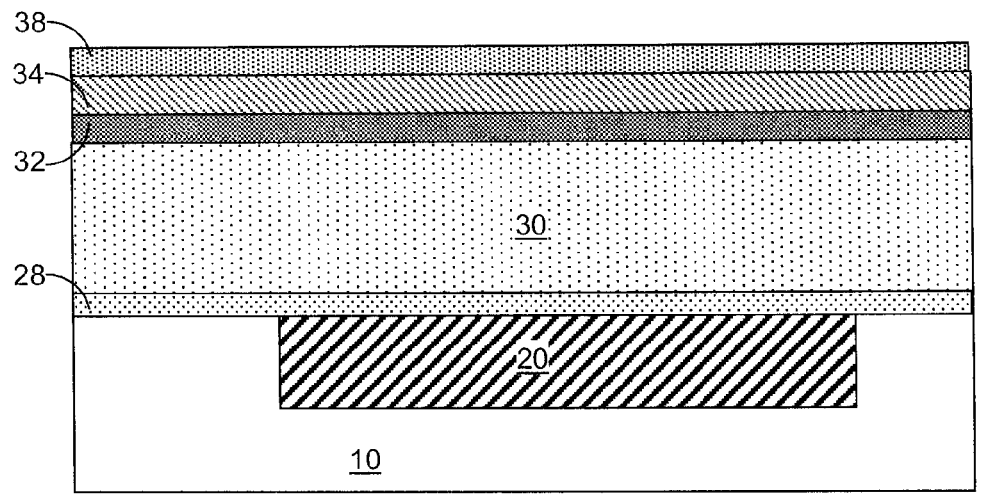
FIG. 7 is a vertical cross-sectional view of a second exemplary structure after formation of a titanium nitride layer and a dielectric oxide layer according to a second embodiment of the present disclosure.

Referring to FIG. 7, a second exemplary structure according to a second embodiment of the present disclosure can be derived from the first exemplary structure of FIG. 1 by depositing a dielectric oxide layer 38 directly on according to a second embodiment of the present disclosure. The dielectric oxide layer 38 can have the same composition and thickness as in the first embodiment. The dielectric oxide layer 38 can be formed by the same method as in the first embodiment. The dielectric oxide layer 38 is optional. Embodiments in which a dielectric oxide layer 38 is not employed are expressly contemplated herein.

Figure 8:
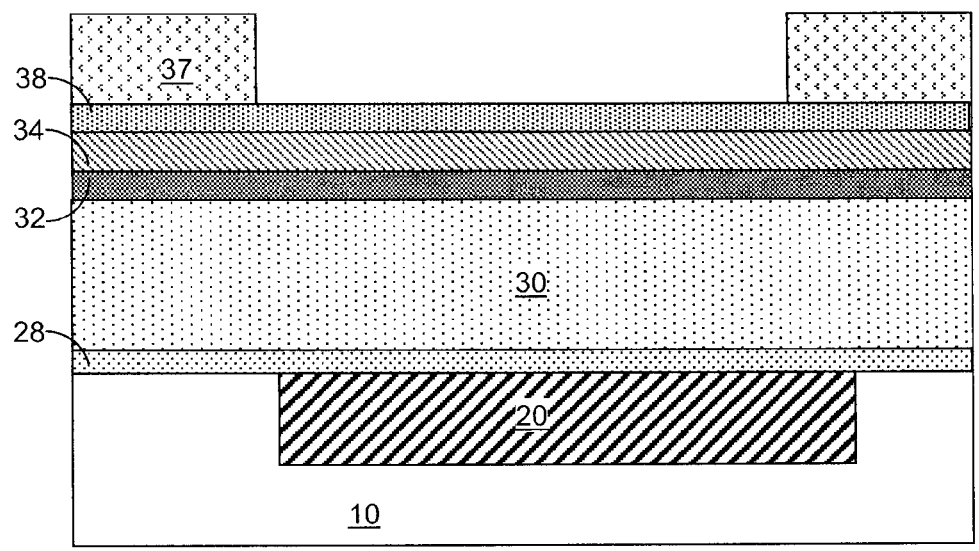
FIG. 8 is a vertical cross-sectional view of the second exemplary structure after application and patterning of a first photoresist layer according to the second embodiment of the present disclosure.

Referring to FIG. 8, a first photoresist layer 37 is applied over the dielectric oxide layer 38, and is lithographically patterned with the first pattern in the same manner as in the first embodiment. The first photoresist layer 37 is applied directly on the top surface of the dielectric oxide layer 38. The first photoresist layer 37 includes a first pattern that includes at least a first opening therein.

Figure 9:
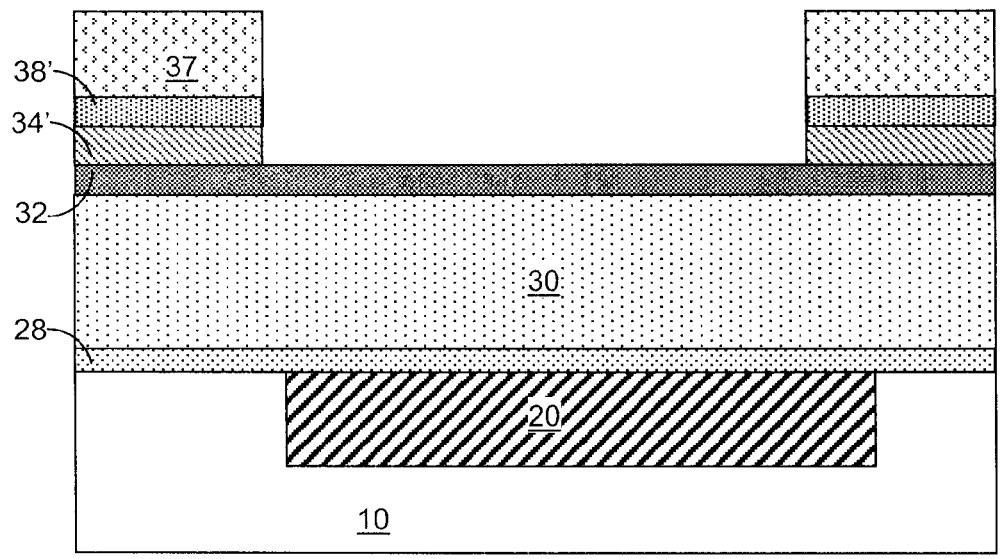
FIG. 9 is a vertical cross-sectional view of the second exemplary structure after patterning a titanium nitride layer with a first pattern layer according to a second embodiment of the present disclosure.

Referring to FIG. 9, the dielectric oxide layer 38 and the TiN layer 34 are patterned by at least one anisotropic etch employing the first photoresist layer 37 as an etch mask. The physically exposed portions of the dielectric oxide layer 38 and the TiN layer 38 are etched, and by etching the physically exposed portions of the TiN layer 34 employing the first photoresist layer 37 as an etch mask.

The etch that removes physically exposed portions of the dielectric oxide layer 38 can be a dry etch or a wet etch. The remaining portion of the dielectric oxide layer 38 constitutes a patterned dielectric oxide layer 38' including the first pattern. The etch that removes physically exposed portions of the TiN layer 34 can be a dry etch or a wet etch, and can be selective to the dielectric hard mask layer 32. The remaining portion of the TiN layer 34 after the etch includes the first pattern such that the area of the first opening corresponds to the opening in the remaining portion of the TiN layer 34. The remaining portion of the TiN layer 34 is herein referred to as a patterned TiN layer 34'. The first photoresist layer 37 can be subsequently removed, for example, by ashing.

Figure 10:
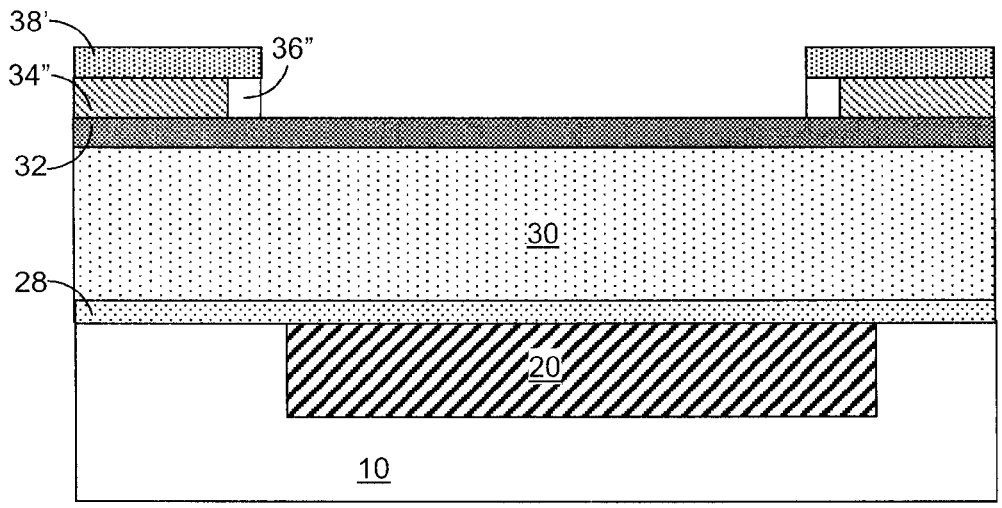
FIG. 10 is a vertical cross-sectional view of the second exemplary structure after converting surface portions of the patterned titanium nitride layer into a titanium oxynitride layer according to the second embodiment of the present disclosure.

Referring to FIG. 10, surface portions of the patterned titanium nitride layer 34' are converted into a patterned titanium oxynitride layer 36''. The conversion of the surface portions of the patterned titanium nitride layer 34' into a patterned titanium oxynitride layer 36'' can be performed by a plasma treatment or electrochemical oxidation. Any of the plasma treatment processes or electrochemical treatment processes that can be employed at the processing step of FIG. 2 may be employed at this step, provided that some portions of the patterned titanium nitride layer 34' remain unoxidized after formation of the patterned titanium oxynitride layer 36'. The patterned titanium oxynitride layer 36' is formed along the periphery of the opening in the patterned dielectric oxide layer 38', and can be ring-shaped (i.e., topologically homeomorphic to a torus). The patterned titanium oxynitride layer 36' includes the first pattern (as modified by any volume changes accompanying partial oxidation of the patterned titanium nitride layer 34' and with accompanying lateral offsets in the locations of outer sidewalls of the patterned titanium oxynitride layer 36' relative to the sidewalls of the patterned titanium nitride layer 34'). The remaining portion of the patterned titanium nitride layer 34' after formation of the patterned titanium oxynitride layer 36' is herein referred to as a remnant TiN layer 34". A stack of the remnant TiN layer 34" and the patterned titanium oxynitride layer 36' overlies the dielectric hard mask layer 32, and includes the first pattern. The thickness of the planar portion of the patterned titanium oxynitride layer 36' above the remnant TiN layer 34" can be from 10 nm to 30 nm, although lesser and greater thicknesses can also be employed. The thickness of the remnant TiN layer 34" can be from 10 nm to 30 nm, although lesser and greater thicknesses can also be employed.

Figure 11:
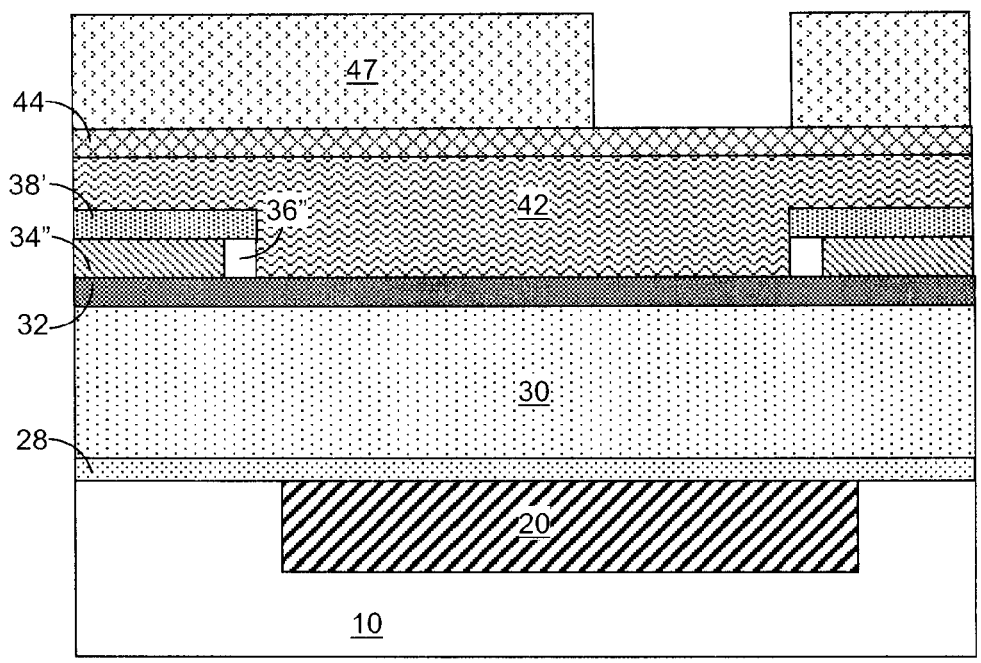
FIG. 11 is a vertical cross-sectional view of the second exemplary structure after formation of a lithographic stack including a photoresist layer and patterning of the photoresist layer with a second pattern according to the second embodiment of the present disclosure.

Referring to FIG. 11, a lithographic stack including an organic planarization layer (OPL) 42, an optional antireflective coating (ARC) layer 44, and a second photoresist layer 47 is formed over the patterned titanium oxynitride layer 36' in the same manner as in the first embodiment. The processing steps illustrated in FIG. 4 may be employed.

Figure 12:
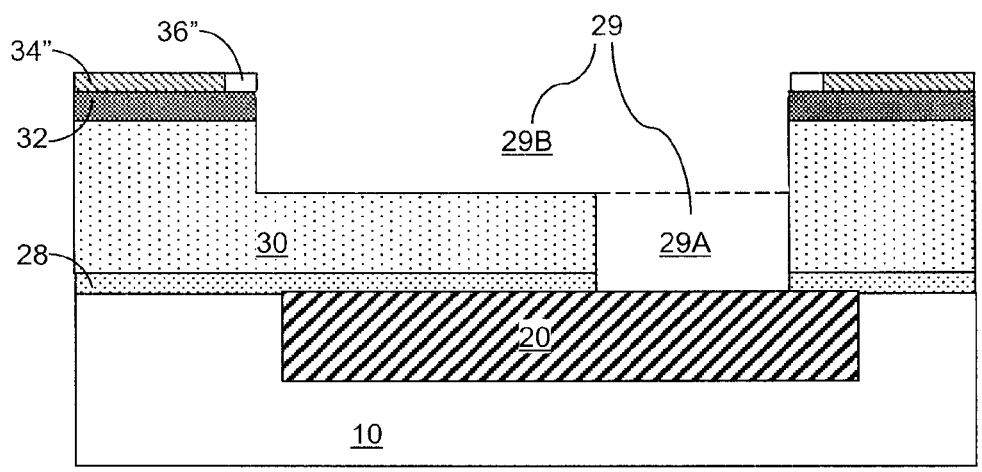
FIG. 12 is a vertical cross-sectional view of the second exemplary structure after transfer of a composite pattern of the first and second patterns into the interconnect-level dielectric material layer according to the second embodiment of the present disclosure.

Referring to FIG. 12, the processing steps corresponding to FIG. 5 are subsequently performed to form a dual damascene cavity 29 in the interconnect-level dielectric layer 30. The interconnect-level dielectric material layer 30 is etched employing a combination of the patterned lithographic material stack (42, 44, 47; See FIG. 9) and the patterned titanium oxynitride layer 36' to form the dual damascene cavity 29, which is embedded within the interconnect-level dielectric material layer 30. Sidewalls of the line cavity 29B are vertically coincident with outer sidewalls of the patterned titanium oxynitride layer 36' upon the formation of the dual damascene cavity 29.

Figure 13:
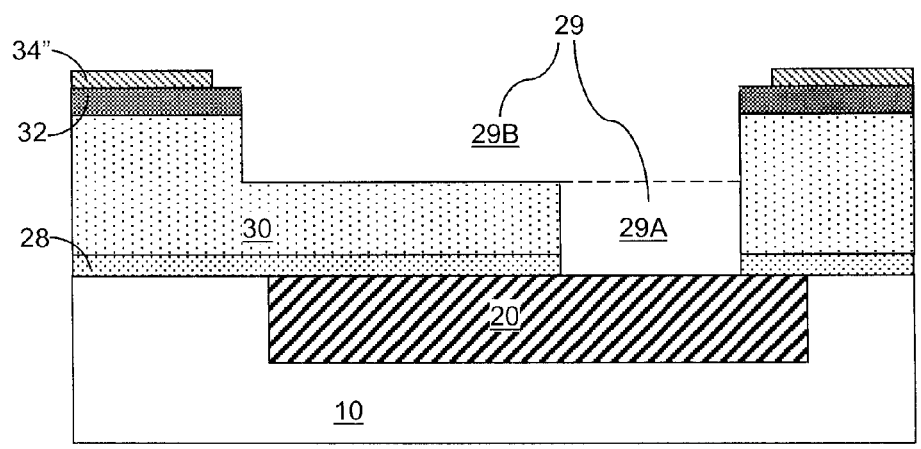
FIG. 13 is a vertical cross-sectional view of the second exemplary structure after removal of the titanium oxynitride layer selective to the titanium nitride layer according to the second embodiment of the present disclosure.

Referring to FIG. 13, the patterned titanium oxynitride layer 36' can be removed selective to the remnant TiN layer 34", the dielectric hard mask layer 32, and the interconnect-level dielectric layer 30. The selective removal of the patterned titanium oxynitride layer 36' can be effected, for example, employing a wet etch, which can employ, for example, dilute hydrofluoric acid. The sidewalls of the line cavity 29B are laterally offset from outer sidewall of the remnant TiN layer 34" upon the removal of the patterned titanium oxynitride layer 36' by the lateral thickness of the patterned titanium oxynitride layer 36'.

Figure 14:
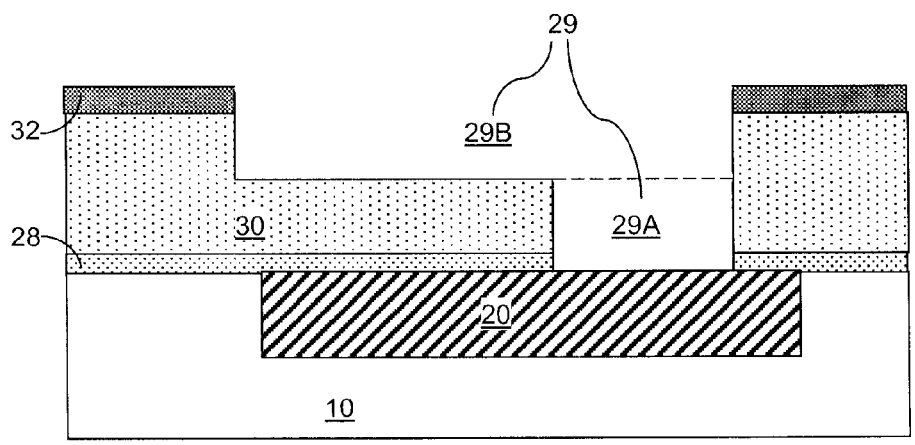
FIG. 14 is a vertical cross-sectional view of the second exemplary structure after removal of the patterned titanium nitride layer according to the second embodiment of the present disclosure.

Referring to FIG. 14, the patterned titanium nitride layer 34" can be subsequently removed selective to the dielectric hard mask layer 32 and the interconnect-level dielectric layer 30, for example, by a wet etch that employs a combination of a hot dilute hydrofluoric acid and citric acid. Removal of the patterned titanium nitride layer 34" at this step is removal, and may be postponed until after electroplating of copper. In this case, the patterned titanium nitride layer 34" may be removed during a chemical mechanical planarization process that forms metal interconnect structures.

Figure 15:
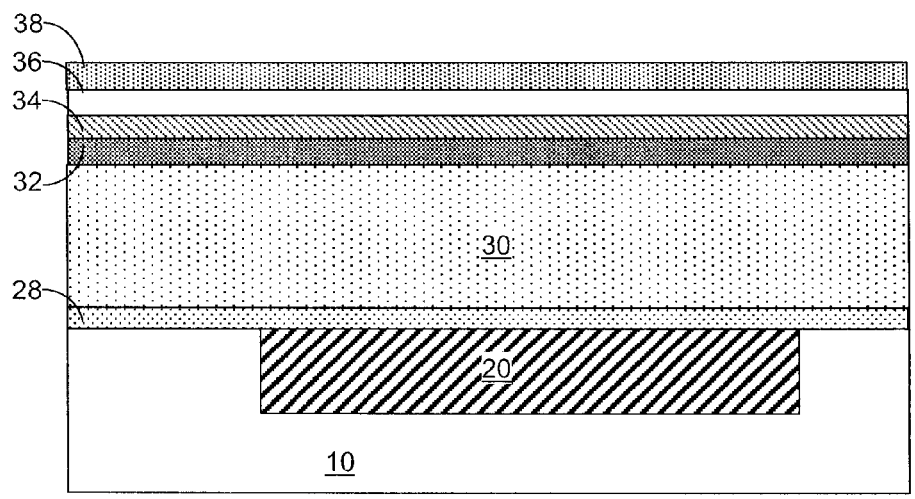
FIG. 15 is a vertical cross-sectional view of a third exemplary structure after conversion of an upper portion of a titanium nitride layer into a titanium oxynitride layer and formation of a dielectric oxide layer according to a third embodiment of the present disclosure.

Referring to FIG. 15, a third exemplary structure according to a third embodiment of the present disclosure can be derived from the first exemplary structure of FIG. 1 by converting an upper portion of the TiN layer of FIG. 1 into a titanium oxynitride layer 36, while not converting a lower portion of the TiN layer of FIG. 1 into a titanium oxynitride material portion. The conversion of the upper portion of the TiN layer of FIG. 1 into a titanium oxynitride layer 36 can be performed by a plasma treatment or electrochemical oxidation. Any of the plasma treatment processes or electrochemical treatment processes that can be employed at the processing step of FIG. 2 may be employed at this step provided that a lower portion of the titanium nitride layer 34 remain unoxidized after formation of the titanium oxynitride layer 36. The thickness of the titanium oxynitride layer 36 above the remaining TiN layer 34 can be from 10 nm to 30 nm, although lesser and greater thicknesses can also be employed. The thickness of the remaining TiN layer 34 can be from 10 nm to 30 nm, although lesser and greater thicknesses can also be employed. Optionally, a dielectric oxide layer 38 may be formed on the titanium oxynitride layer 36. The dielectric oxide layer 38 can have the same composition and thickness as in the first embodiment. The dielectric oxide layer 38 can be formed by the same method as in the first embodiment. The dielectric oxide layer 38 is optional. Embodiments in which a dielectric oxide layer 38 is not employed are expressly contemplated herein.

Figure 16:
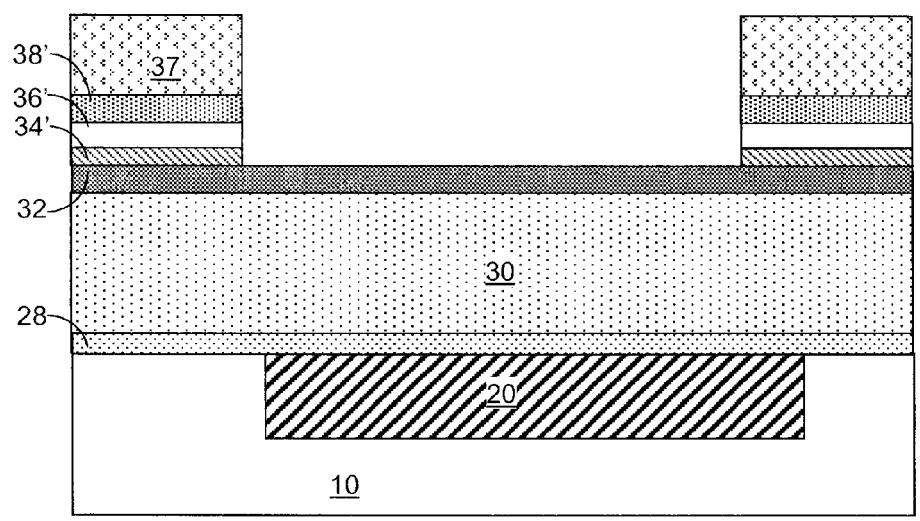
FIG. 16 is a vertical cross-sectional view of the third exemplary structure after patterning the stack of the dielectric oxide layer, the titanium nitride layer, and the titanium oxynitride layer with a first pattern according to the third embodiment of the present disclosure.

Referring to FIG. 16, a first photoresist layer 37 is applied directly on the top surface of the titanium oxynitride layer 36, and is lithographically patterned with a first pattern. The first pattern includes at least a first opening therein. Physically exposed portions of the titanium oxynitride layer 36 and the TiN layer 34 within the first opening is etched employing the first photoresist layer 37 as an etch mask. The etch that removes physically exposed portions of the titanium oxynitride layer 36 and the TiN layer can be a dry etch or a wet etch, and can be selective to the dielectric hard mask layer 32. The remaining portion of the titanium oxynitride layer 36 is herein referred to as a patterned titanium oxynitride layer 36'. The remaining portion of the TiN layer 34 is herein referred to as a patterned TiN layer 34'. The stack of the patterned TiN layer 34' and the patterned titanium oxynitride layer 36' includes the first pattern such that the area of the first opening corresponds to the opening in the stack of the patterned TiN layer 34' and the patterned titanium oxynitride layer 36'. The first photoresist layer 37 can be subsequently removed, for example, by ashing.

Figure 17:
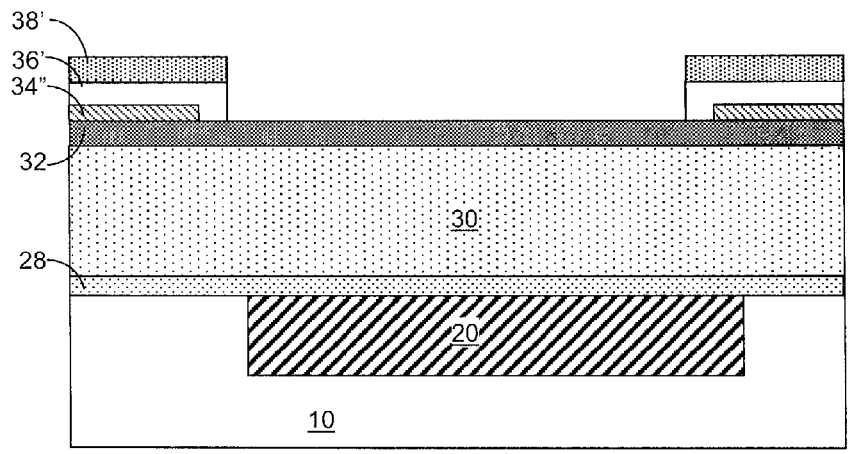
FIG. 17 is a vertical cross-sectional view of the third exemplary structure after conversion of surface portions of the patterned titanium nitride layer into titanium oxynitride portions according to the third embodiment of the present disclosure.

Referring to FIG. 17, sidewalls of the patterned titanium nitride layer 34' are partially oxidized by plasma oxidation or electrochemical treatment. Surface portions of the patterned titanium nitride layer 34' that underlie the sidewalls are converted into titanium oxynitride material portions, and are merged into the patterned titanium oxynitride layer 36'. The conversion of the surface portions of the patterned titanium nitride layer 34' into titanium oxynitride material portions can be performed by a plasma treatment or electrochemical oxidation. Any of the plasma treatment processes or electrochemical treatment processes that can be employed at the processing step of FIG. 2 may be employed at this step, provided that some portions of the patterned titanium nitride layer 34' remain unoxidized underneath the patterned titanium oxynitride layer 36'. The patterned titanium oxynitride layer 36' includes the first pattern (as modified by any volume changes accompanying partial oxidation of the surface portions of patterned titanium nitride layer 34' and with accompanying lateral offsets in the locations of outer sidewalls of the patterned titanium oxynitride layer 36' relative to the sidewalls of the patterned titanium nitride layer 34'). The remaining portion of the patterned titanium nitride layer 34' after conversion of the surface portions of the patterned titanium nitride layer 34' into titanium oxynitride material portions is herein referred to as a remnant TiN layer 34". A stack of the remnant TiN layer 34" and the patterned titanium oxynitride layer 36' overlies the dielectric hard mask layer 32, and includes the first pattern. The thickness of the planar portion of the patterned titanium oxynitride layer 36' above the remnant TiN layer 34" can be from 10 nm to 30 nm, although lesser and greater thicknesses can also be employed.

The thickness of the remnant TiN layer 34" can be from 10 nm to 30 nm, although lesser and greater thicknesses can also be employed.

Subsequently, the processing steps of FIGS. 10, 11, and 12 can be performed. Optionally, the processing steps of FIG. 14 can also be performed.

Figure 18:
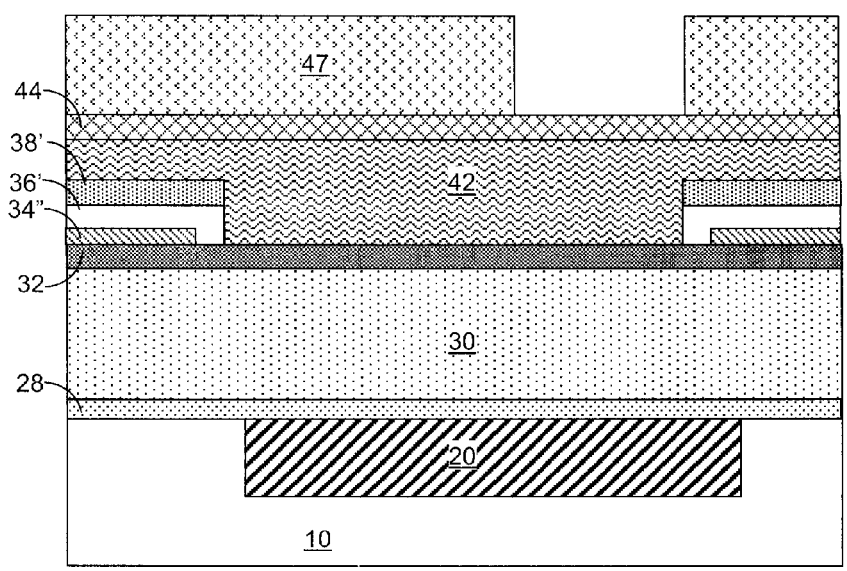
FIG. 18 is a vertical cross-sectional view of the third exemplary structure after formation of a lithographic stack including a photoresist layer and patterning of the photoresist layer with a second pattern according to the third embodiment of the present disclosure.

Referring to FIG. 18, a lithographic stack including an organic planarization layer (OPL) 42, an optional antireflective coating (ARC) layer 44, and a second photoresist layer 47 is formed over the patterned dielectric oxide layer 38' and the patterned titanium oxynitride layer 36' in the same manner as in the first embodiment. The processing steps illustrated in FIG. 4 may be employed.

Figure 19:
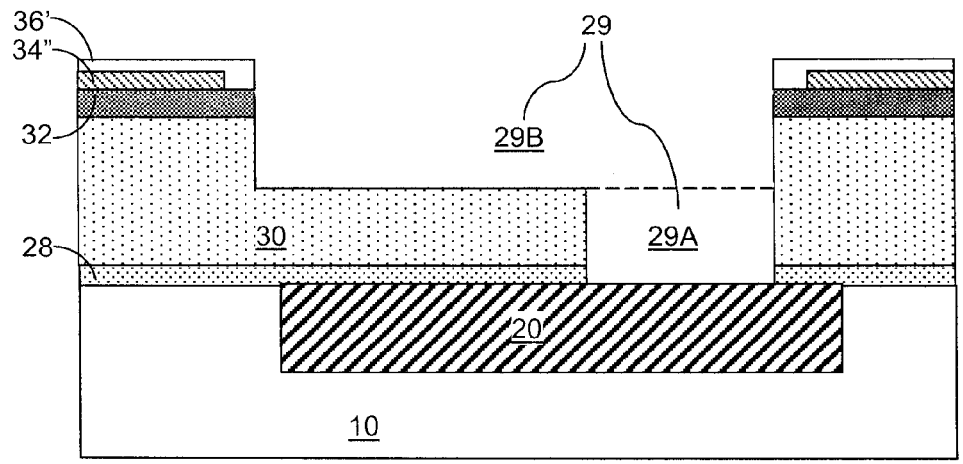
FIG. 19 is a vertical cross-sectional view of the third exemplary structure after transfer of a composite pattern of the first and second patterns into the interconnect-level dielectric material layer according to the third embodiment of the present disclosure.

Referring to FIG. 19, the processing steps corresponding to FIG. 5 are subsequently performed to form a dual damascene cavity 29 in the interconnect-level dielectric layer 30. The interconnect-level dielectric material layer 30 is etched employing a combination of the patterned lithographic material stack (42, 44, 47; See FIG. 9) and the patterned titanium oxynitride layer 36' to form the dual damascene cavity 29, which is embedded within the interconnect-level dielectric material layer 30. Sidewalls of the line cavity 29B are vertically coincident with outer sidewalls of the patterned titanium oxynitride layer 36' upon the formation of the dual damascene cavity 29.

Figure 20:
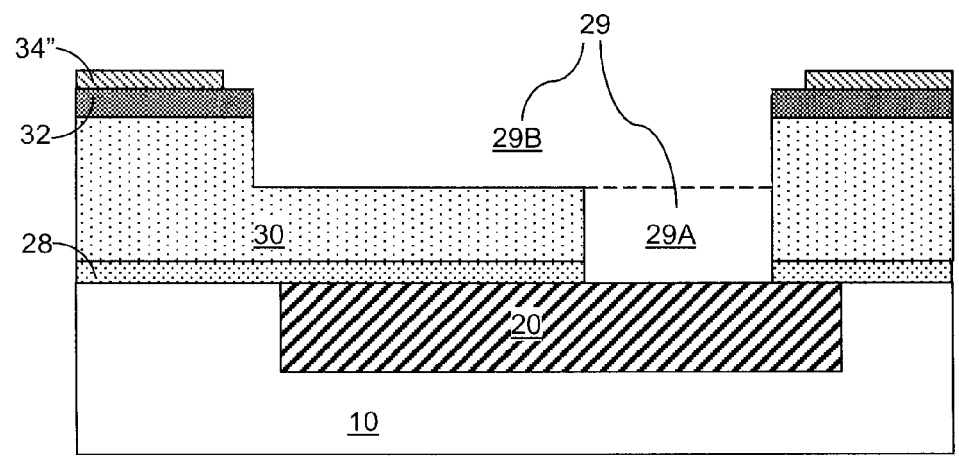
FIG. 20 is a vertical cross-sectional view of the third exemplary structure after removal of the titanium oxynitride layer selective to the titanium nitride layer according to the third embodiment of the present disclosure.

Referring to FIG. 20, the patterned titanium oxynitride layer 36' can be removed selective to the remnant TiN layer 34", the dielectric hard mask layer 32, and the interconnect-level dielectric layer 30. The selective removal of the patterned titanium oxynitride layer 36' can be effected, for example, employing a wet etch, which can employ, for example, dilute hydrofluoric acid or a combination of hydrogen peroxide and trans-1,2-cyclohexanediaminetetraacetic acid (CDTA). The sidewalls of the line cavity 29B are laterally offset from outer sidewall of the remnant TiN layer 34" upon the removal of the patterned titanium oxynitride layer 36' by the lateral thickness of the patterned titanium oxynitride layer 36'.

Figure 21:
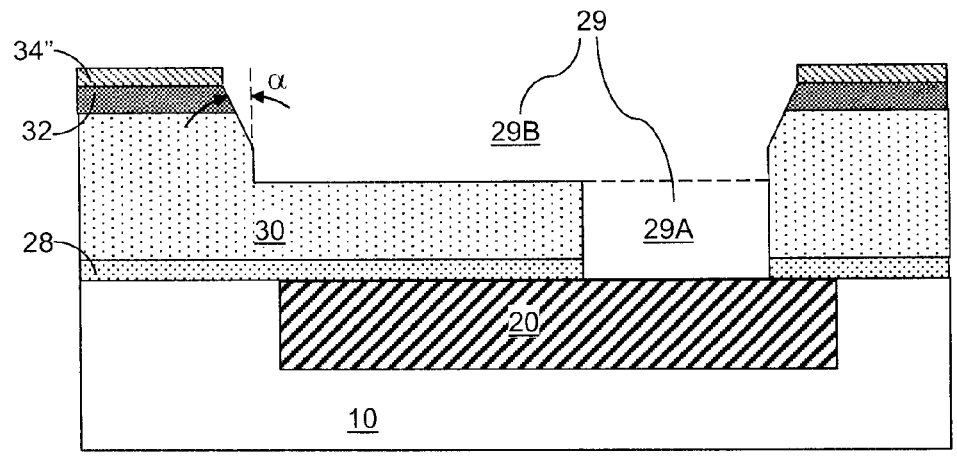
FIG. 21 is a vertical cross-sectional view of a fourth exemplary structure after formation of chamfers on sidewalls of a cavity employing a patterned titanium oxynitride layer as an etch mask according to a fourth embodiment of the present disclosure.

Referring to FIG. 21, a fourth exemplary structure according to a fourth embodiment of the present disclosure can be derived from the second exemplary structure of FIG. 11 (or the third exemplary structure after performing the processing steps of FIGS. 9, 10, and 11) by anisotropically etching physically exposed portions of the dielectric hard mask layer 32 and upper portions of the sidewalls of the line trench 29B. Portions of the interconnect-level dielectric material layer having physically exposed horizontal surfaces are anisotropically etched, and chamfers on sidewalls of the line cavity 29B by the anisotropic etch. The remnant titanium nitride layer 34" is employed as an etch mask. The angle α of the chamfers, as measured from a vertical line, may be from 2 degrees to 20 degrees, although lesser and greater angles can also be employed. In one embodiment, the anisotropic etch may be a reactive ion etch employing an etch chemistry that etches the dielectric material of the dielectric hard mask layer 32 while generating a viscous etch residue. For example, if the dielectric hard mask layer 32 includes silicon oxide, an anisotropic etch employing a hydrochlorocarbon etchant may be employed to form the chamfers. The chamfers can provide rounding of the upper portion of the line trench 29B and can avoid formation of sharp angles or undercut regions.

Figure 22:
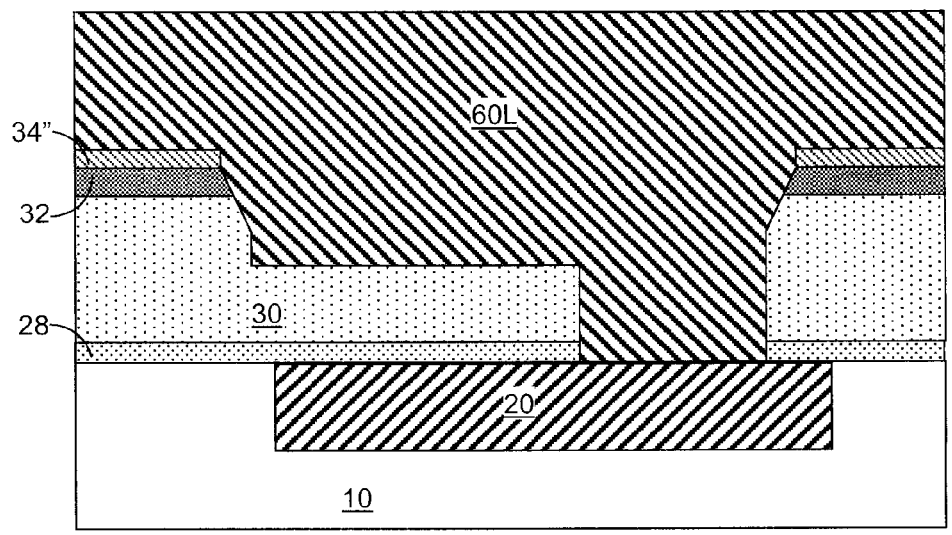
FIG. 22 is a vertical cross-sectional view of the fourth exemplary structure after filling the cavity with a conductive material according to the fourth embodiment of the present disclosure.

Referring to FIG. 22, the dual damascene cavity 29 can be filled with a conductive material layer 60L. The conductive material layer 60L can include copper, aluminum, tungsten, alloys thereof, or any other material that can be employed for forming a metal line and/or a metal via. In one embodiment, a metallic liner material such as TiN, TaN, WN, TiC, TaC, WC, Ta, Ti, W, or combinations thereof may be optionally employed. In one embodiment, the metallic liner material can be a stack of multiple liner materials such as a stack of TaN and Ta. The conductive material layer 60L can be deposited, for example, by physical vapor deposition (PVD), chemical vapor deposition (CVD), electroplating, electroless plating, vacuum evaporation, or combinations thereof.

Figure 23:
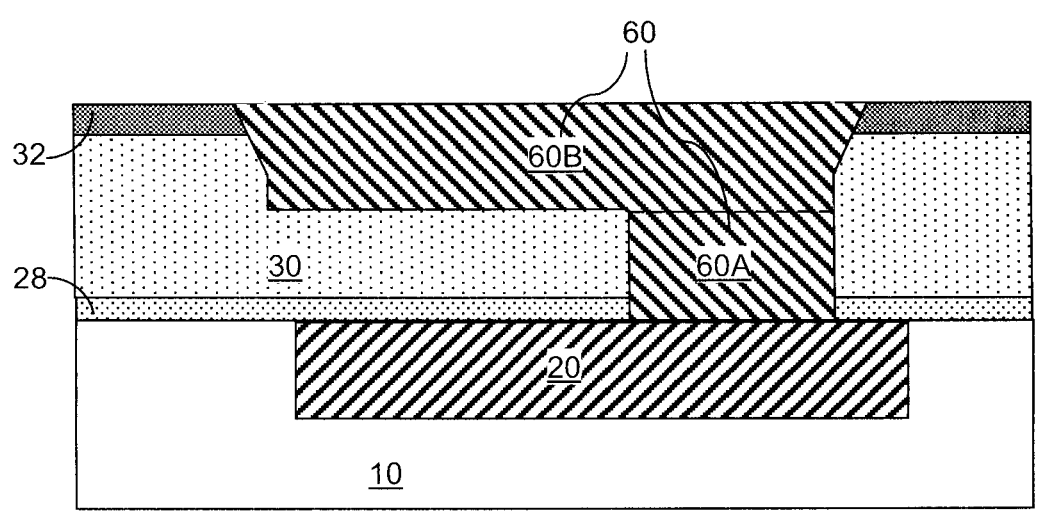
FIG. 23 is a vertical cross-sectional view of the fourth exemplary structure after formation of an integrated line and via structure within the interconnect-level dielectric material layer according to the fourth embodiment of the present disclosure.

Referring to FIG. 23, the conductive material layer 60L is planarized, for example, by chemical mechanical planarization (CMP). The portion of the conductive material layer 60L above the top surface of the dielectric hard mask layer 60L is removed by the planarization process. The remaining portion of the conductive material layer 60L that fills the dual damascene cavity 29 is an integrated line and via structure 60, which includes a metal via structure 60A and a metal line structure 60B that are formed as an integral structure, i.e., a contiguous structure without any interface therebetween. The chamfers on sidewalls of the interconnect-level dielectric layer 30 eliminate trapping of any residual materials during the planarization process, thereby enhancing process stability and reducing the defect density in the metal interconnect structure thus obtained.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A method of forming a patterned structure comprising:
   forming a vertical stack including an interconnect-level dielectric material layer, a dielectric hard mask layer, and a patterned titanium oxynitride layer defining a first pattern over a substrate, wherein said patterned titanium oxynitride layer is formed by:
      forming a blanket titanium nitride (TiN) layer on said dielectric hard mask layer;
      forming a dielectric oxide layer over said blanket TiN layer;
      patterning said dielectric oxide layer and said blanket TiN layer with said first pattern to form a stack of a patterned TiN layer and a patterned dielectric oxide layer; and
      converting surface portions of said patterned TiN layer into a patterned titanium oxynitride layer;
   forming a patterned lithographic material stack including an organic planarizing layer (OPL) located on said patterned titanium oxynitride layer, an antireflective coating (ARC) layer located over said OPL, and a patterned photoresist layer located over said ARC, said patterned photoresist layer defining a second pattern; and
   etching said interconnect-level dielectric material layer employing a combination of said patterned lithographic material stack and said patterned titanium oxynitride layer to form a cavity embedded within said interconnect-level dielectric material layer, wherein said first pattern includes a first opening, said second pattern includes a second opening, and an area of said first opening and an area of said second opening overlap.

2. The method of claim 1, wherein said converting of said surface portions of said patterned TiN layer into said patterned titanium oxynitride layer is performed by plasma oxidation in a plasma of oxygen-containing gases.

3. The method of claim 1, wherein a stack of a remnant TiN layer and said patterned titanium oxynitride layer is formed after said conversion of said surface portions of said patterned TiN layer.

4. The method of claim 3, wherein a sidewall of said cavity is vertically coincident with an outer sidewall of said patterned titanium oxynitride layer upon said etching of said interconnect-level dielectric material layer.

5. The method of claim 4, further comprising removing said patterned titanium oxynitride layer selective to said remnant TiN layer after said etching of said interconnect-level dielectric material layer.

6. The method of claim 5, wherein said sidewall of said cavity is laterally offset from an outer sidewall of said remnant TiN layer upon said removal of said patterned titanium oxynitride layer.

7. The method of claim 5, further comprising forming chamfers on sidewalls of said cavity by anisotropically etching portions of said interconnect-level dielectric material layer having physically exposed horizontal surfaces.

8. The method of claim 1, wherein said titanium oxynitride layer has a composition of $TiO_xN_y$, wherein x is in a range from 0.1 to 1.9, and y is in a range from 0.05 to 0.95, and $(1-x)+2y$ is in a range from 0.9 to 2.4.

9. The method of claim 1, wherein said dielectric hard mask layer comprises a material selected from silicon oxide, silicon oxynitride, silicon nitride, and nitrogen-doped organosilicate glass.

* * * * *